United States Patent
Reshchikov et al.

(10) Patent No.: US 12,514,033 B2
(45) Date of Patent: Dec. 30, 2025

(54) P-TYPE BERYLLIUM DOPED GALLIUM NITRIDE SEMICONDUCTORS AND METHODS OF PRODUCTION

(71) Applicant: Virginia Commonwealth University, Richmond, VA (US)

(72) Inventors: Michael A. Reshchikov, Henrico, VA (US); Denis O. Demchenko, Henrico, VA (US)

(73) Assignee: Virginia Commonwealth University, Richmond, VA (US)

( * ) Notice: Subject to any disclaimer, the term of this patent is extended or adjusted under 35 U.S.C. 154(b) by 545 days.

(21) Appl. No.: 17/660,529

(22) Filed: Apr. 25, 2022

(65) Prior Publication Data

US 2022/0344539 A1   Oct. 27, 2022

Related U.S. Application Data

(60) Provisional application No. 63/178,623, filed on Apr. 23, 2021.

(51) Int. Cl.
*H10H 20/82* (2025.01)
*H10H 20/01* (2025.01)
*H10H 20/825* (2025.01)

(52) U.S. Cl.
CPC ........ *H10H 20/8252* (2025.01); *H10H 20/01* (2025.01); *H10H 20/01335* (2025.01)

(58) Field of Classification Search
CPC . H01L 33/325; H10D 48/341; H10H 20/8252
See application file for complete search history.

(56) References Cited

U.S. PATENT DOCUMENTS

| | | | |
|---|---|---|---|
| 4,683,483 A * | 7/1987 | Burnham | H10D 8/25 438/983 |
| 4,701,646 A * | 10/1987 | Richardson | H03K 19/0952 250/214 SG |
| 5,814,534 A | 9/1998 | Kimura et al. | |
| 6,207,469 B1 * | 3/2001 | Ota | H01L 21/3245 438/22 |
| 6,342,405 B1 * | 1/2002 | Major | H01L 33/32 438/46 |
| 6,392,282 B1 * | 5/2002 | Sahara | H10F 30/225 257/E27.128 |
| 6,653,248 B2 | 11/2003 | Kean et al. | |
| 8,575,659 B1 | 11/2013 | Bui et al. | |
| 9,748,113 B2 | 8/2017 | Armour et al. | |
| 10,109,763 B2 | 10/2018 | Hyun et al. | |
| 10,497,743 B2 | 12/2019 | Robin et al. | |

(Continued)

OTHER PUBLICATIONS

Teisseyre, H. et al., "GaN doped with beryllium—An effective light converter for white light emitting diodes", Appl. Phys. Lett. 103, 011107, 2013.

(Continued)

*Primary Examiner* — Ida M Soward
(74) *Attorney, Agent, or Firm* — WCF IP

(57) ABSTRACT

Exemplary devices such as ultraviolet light emitting diodes (UV LEDs) are disclosed which include conductive Be-doped p-type material with greatly improved efficiency over UV LEDs employing other dopants such as Mg. Exemplary processes for producing Be-doped p-type regions in semiconductor devices are also described.

5 Claims, 8 Drawing Sheets

(56) References Cited

U.S. PATENT DOCUMENTS

| | | | |
|---|---|---|---|
| 10,975,492 B2 | 4/2021 | D'Evelyn et al. | |
| 2009/0050962 A1* | 2/2009 | Huang | H01L 21/823878 |
| | | | 438/297 |
| 2011/0175199 A1* | 7/2011 | Lin | H10D 62/114 |
| | | | 257/605 |
| 2013/0082273 A1* | 4/2013 | Ting | H10H 20/0133 |
| | | | 438/46 |

OTHER PUBLICATIONS

Tuomisto, F. et al., "Amphoteric Be in GaN: Experimental Evidence for Switching between Substitutional and Interstitial Lattice Sites", Phys. Rev. Lett. 119, 196404, 2017.

Chia, L. et al., "The structure of the beryllium-hydrogen complex in silicon", Journal of Physics and Chemistry of Solids, vol. 53, Issue 4, Apr. 1992, pp. 585-589.

Haffouz, S. et al., "p-doping of GaN by MOVPE", The Materials Research Society, Internet Journal of Nitride Semiconductor Research, vol. 2, Article 37, 1997.

Aalto University. "The next generation of power electronics? Gallium nitride doped with beryllium: How to cut down energy loss in power electronics? The right kind of doping." ScienceDaily. ScienceDaily, Nov. 9, 2017. <www.sciencedaily.com/releases/2017/11/171109131201.htm>.

\* cited by examiner

P-TYPE BERYLLIUM DOPED GALLIUM NITRIDE SEMICONDUCTORS AND METHODS OF PRODUCTION

CROSS-REFERENCE TO RELATED APPLICATIONS

This application claims the benefit of U.S. Provisional Patent Application No. 63/178,623, filed Apr. 23, 2021, the complete contents of which are herein incorporated by reference.

STATEMENT OF GOVERNMENT INTEREST

This invention was made with government support under DMR-1904861 awarded by the National Science Foundation. The government has certain rights in the invention.

FIELD OF THE INVENTION

Embodiments generally relate to gallium nitride (GaN) semiconductor devices and, more specifically, conductive p-type GaN and p-type AlGaN alloy.

BACKGROUND

Gallium nitride (GaN) is an essential material for modern light-emitting, high-power, and high-frequency devices. Although n-type GaN can be easily produced by doping with Si or Ge, the production of high-quality conductive p-type GaN is a challenging problem. Currently, the only p-type dopant in GaN is magnesium (Mg) substituting for Ga atom ($Mg_{Ga}$). However, a relatively high ionization energy (0.22 eV) of the $Mg_{Ga}$ requires high doping concentrations to achieve p-type conductivity suitable for practical applications. Therefore, a shallow p-type dopant with the ionization energy lower than that of $Mg_{Ga}$ is highly desirable. Alloying GaN with AlN semiconductor results in AlGaN alloy which has the bandgap larger than that of GaN. In particular, AlGaN alloy is used for UV LEDs emitting at 220-300 nm, where Mg-doped AlGaN serves as p-type region of the LED.

First-principles calculations predict the 0/− transition level of beryllium (Be) substituting for Ga atom ($Be_{Ga}$) at 0.45-0.65 eV above the valence band maximum. A deep acceptor level originates from the small polaron nature of the $Be_{Ga}$ defect state, i.e. localized hole self-trapped by significant lattice distortions. The optical transition via this state is predicted to have a maximum at 1.5-1.8 eV. This behavior is typical for a wide range of defects in nitrides and oxides. However, a controversy remains: on one hand, a successful p-type doping by Be has not been demonstrated, and Be-doped GaN is usually semi-insulating. On the other hand, there is no experimental evidence for the deep acceptor state of $Be_{Ga}$ predicted by theory.

Photoluminescence (PL) studies of Be-doped GaN grown by molecular beam epitaxy (MBE) revealed two Be-related luminescence bands: the ultraviolet ($UVL_{Be}$) and yellow ($YL_{Be}$) bands. The $UVL_{Be}$ band consists of the zero-phonon line (ZPL) at 3.38 eV followed by a series of LO phonon replicas. The corresponding acceptor ionization energy was estimated between 60 and 250 meV, with a large uncertainty due to the unreliable identification of the type of transitions. The $YL_{Be}$ band, which was recently attributed to the $Be_{Ga}O_N$ complex, has a Gaussian-like shape with a maximum at about 2.2 eV and full width at half maximum (FWHM) of about 0.5 eV. The predicted red PL band (with a maximum at 1.5-1.8 eV) has not been observed in PL experiments. In particular, the background signal at these photon energies was more than two orders of magnitude weaker than the $UVL_{Be}$ band. Electron paramagnetic resonance (EPR) studies on Be-doped GaN initially proposed the $Be_{Ga}$ acceptor level at 0.7 eV above the valence band maximum (VBM), which seemed to confirm the deep nature of the $Be_{Ga}$ acceptor. However, it was later concluded from such studies that the photo-EPR signal originated from the carbon acceptor $C_N$, once again casting doubt about the deep versus shallow nature of the $Be_{Ga}$.

Hydrogen plays a significant role in the properties of semiconductors. In particular, hydrogen passivates defects and impurities, which can be beneficial for device design. A vivid example is the development of p-type GaN, which ended with a breakthrough in the fabrication of bright blue LEDs and various solid-state lighting applications. Mg-doped GaN (GaN:Mg) is high-resistivity due to compensation by parasitic donors, as well as passivation of Mg acceptor with H, if it is grown by techniques involving hydrogen, such as metalorganic chemical vapor deposition (MOCVD). Thermal annealing at T≈800° C. in a hydrogen-free ambient activates Mg acceptors and results in a conductive p-type material. In Mg-doped GaN grown by MOCVD, hydrogen from the source gas incorporates in GaN in amounts approximately equal to that of Mg over the wide range of Mg doping (between $6\times10^{16}$ and $3\times10^{19}$ $cm^{-3}$), which suggests the formation of the $Mg_{Ga}$—H complexes. Illumination with ultraviolet (UV) light helps dissociate the $Mg_{Ga}$—H complexes, and the annealing temperature can be reduced to 500° C. The presence of the $Mg_{Ga}$—H complexes and hydrogen removal by thermal annealing was also confirmed by observing the $Mg_{Ga}$—H local vibrational mode at 3125 $cm^{-1}$. Upon annealing of GaN:Mg samples at T=850° C., all $Mg_{Ga}$—H complexes dissociate, and the concentration of electrically active $Mg_{Ga}$ acceptors approaches the total concentration of Mg. For high concentrations of Mg (more than $10^{19}$ $cm^{-3}$), two types of Mg—H complexes are proposed: a metastable one that leads to activation of $Mg_{Ga}$ acceptors after annealing and a stable one (electrically inactive), which remains after the annealing in samples with a high concentration of Mg. The lowest resistivity of Mg-doped GaN is about 0.2Ω cm, achieved with the concentration of holes $2\text{-}3\times10^{18}$ $cm^{-3}$ and the hole mobility 9-19 $cm^2/Vs$. The highest room-temperature mobility of 43 $cm^2/Vs$ was demonstrated for two-dimensional hole gas in GaN-based heterostructures.

While experimental results indicate that $Mg_{Ga}$—H complexes are formed in MOCVD-grown GaN:Mg, the question of whether they are electrically active is still not clear. Some calculations predict that the $Mg_{Ga}$—H complexes are electrically active, with the 0/+ transition level at 0.13 eV above the valence band maximum (VBM). According to these calculations, the UVL band with a maximum at 3.27 eV in the photoluminescence (PL) spectrum from undoped or Mg-doped GaN is caused by transitions from the conduction band to this donor level of the $Mg_{Ga}$—H complex. However, this attribution of the UVL band in GaN is inconsistent with a very high hole-capture coefficient ($1\times10^{-6}$ $cm^3/s$) for the related defect and the fact that the UVL band is the main PL band in hydrogen-free GaN grown by molecular beam epitaxy (MBE) and doped with Mg with concentrations between $10^{17}$ and $10^{20}$ $cm^{-3}$.

Be-doped GaN is commonly grown by MBE, where the $UVL_{Be}$ band is the dominant feature in the PL spectrum, yet reports on p-type conductivity in such material are rare. The $UVL_{Be}$ band was also observed in bulk GaN:Be grown by the high-pressure method. However, usually only the broad yellow band with a maximum at 2.2 eV, labeled the $YL_{Be}$ band hereafter, is observed from such samples. This $YL_{Be}$ band was previously attributed to the $Be_{Ga}$-$O_N$ complex.

In the only known study where Be-doped GaN was grown by the MOCVD technique, the as-grown GaN:Be was highly resistive, while rapid thermal annealing at 920° C. for 12 seconds in nitrogen ($N_2$) ambient converted the material into a conductive p-type with the room-temperature concentration of free holes $1.7 \times 10^{18}$ cm$^{-3}$ and the acceptor activation energy of 118±4 meV. The $UVL_{Be}$ band was also observed in these samples. However, the passivation mechanism and the activation of the $Be_{Ga}$ acceptor is currently not well understood.

SUMMARY

Various embodiments of the invention have features which take advantage of the low activation energy of the shallow state of Be acceptor in GaN and GaN alloys such as AlGaN and InGaN.

According to an aspect of some embodiments, bright UV LEDs are disclosed in which the p-type region is doped with beryllium (Be). For UV LEDs made of AlGaN and operating at 220-270 nm the conductivity of p-type layer may be crucial; the efficiency of UV LEDs with p-type layer of Be-doped AlGaN alloy may rise by an order of magnitude over prior UV LEDs, such as those relying exclusively on Mg-doped AlGaN alloy as the p-type layer. In the following, everything that is proposed for Be-doped p-type GaN is valid for Be-doped p-type AlGaN.

For p-type region doped with beryllium, in the dark, the holes are bound to the deep state, and the p-type conductivity is very low. However, under UV illumination, the holes are preferentially captured by the shallow state with an expected probability ratio ranging from 100:1 to 1000:1. This happens because the cross-section for the capture of free holes by the shallow state is about 100-1000 times larger than that for the deep state. The preferential capture by the shallow state may also be the result of an instability in the deep state. Under UV illumination, the shallow Be state efficiently captures photogenerated holes and emits them back to the valence band due to temperature (such as room temperature or higher) and low ionization energy of acceptor. Thus, a high concentration of free holes are obtained during the operation of the LED. As a starter, a UV light source that does not involve the Be-doped p-type material may be included. For instance, a Mg-doped AlGaN layer may be included in some embodiments to initiate UV illumination and initially transfer bound holes from the deep state to the shallow state. The Mg-doped region may be small compared to the Be-doped region and included only to start the operation (but may or may not continue to work in parallel with the Be-doped region).

Another aspect of embodiments in this disclosure is exemplary manufacturing processes for a p-type doping route of GaN (or AlGaN alloy) using Be acceptor. According to some exemplary processes, GaN is doped with Be in the presence of hydrogen. Hydrogen (H) is abundantly present during the growth of GaN by the metalorganic chemical vapor deposition (MOCVD) technique. Be forms complexes with H, which are electrically inactive (in other words, H passivates Be). When most Be atoms are passivated by H, the formation of deep donors such as interstitial Be defects is suppressed. The grown material is mildly n-type due to the presence of shallow donors such as O or Si. After growth, the grown samples are annealed at moderate temperatures (e.g., 600-900° C.). The annealing causes the dissociation of the Be—H complexes and removal of H. The $Be_{Ga}$ acceptors are abundantly formed during the annealing and responsible for p-type conductivity.

Example 1 demonstrates the existence of the shallow state of Be acceptor and explains the absence of the deep polaronic state in PL experiments. Experiment and calculations suggest that transitions via the polaronic state are suppressed by the low hole capture efficiency by the polaronic state. This resolves the seeming contradiction between theoretical predictions of the deep state and experimental observations of the shallow state of the $Be_{Ga}$ acceptor. This disclosure describes photoluminescence (PL) measurements combined with hybrid density functional theory to demonstrate that a shallow effective-mass state also exists for the $Be_{Ga}$ acceptor. PL band with a maximum at 3.38 eV reveals a shallow $Be_{Ga}$ acceptor level at 113±5 meV above the valence band, which is the lowest value among any dopants in GaN reported to date. Calculations suggest that the $Be_{Ga}$ is a dual-nature acceptor with the "bright" shallow state responsible for the 3.38 eV PL band, and the "dark", strongly localized small polaronic state due to the difference in the hole capture efficiency between the two states.

Example 2 details considerations for the manufacture of Be-doped GaN or AlGaN. Hybrid functional calculations suggest that straightforward incorporation of Be in GaN will likely lead to compensated high resistivity samples. In this case, beryllium interstitial and nitrogen vacancy are the most likely compensating donors. However, calculations also show that simultaneous incorporation of beryllium and hydrogen in the nitrogen-rich growth regime is likely to lead to the formation of neutral $Be_{Ga}$-$H_i$ complexes. These complexes are energetically favorable and do not exhibit any transition levels in the bandgap. Subsequent annealing in hydrogen-free or nitrogen ambient dissociates these complexes and activates p-type conductivity in GaN. The calculations show that passivation of Be acceptors in GaN leads to p-type material with significantly higher hole conductivity than that in Mg-doped GaN. The calculations are confirmed by experimental results, which demonstrate that annealing of Be-doped GaN at 900° C. drastically increases the shallow $Be_{Ga}$ acceptors' concentration as evidenced by the emergence of the ultraviolet luminescence band associated with these shallow acceptors.

DETAILED DESCRIPTION

Exemplary embodiments employ beryllium (Be) dopant to achieve high p-type conductivity of GaN and AlGaN alloy (e.g., AlGaN) semiconductors. AlGaN alloy is used in some embodiments to increase the semiconductor bandgap and correspondingly the energy of emitted photons (shortens wavelength of emitted light). The specific composition of the AlGaN alloy may vary among embodiments. In some cases, the AlGaN alloy may be similar or even identical to the AlGaN alloys already in use for AlGaN-based UV LEDs with Mg-doped AlGaN as p-type conductive layer, except for the difference in dopant. GaN (or AlGaN) is a key compound in devices such as but not limited to blue and white light-emitting diodes (LEDs). In this disclosure, mentions of "GaN" may generally be substituted with "AlGaN" or "GaN alloy". Similarly, instances of "AlGaN" may generally be substituted with "GaN" or "GaN alloy". GaN alloys other than AlGaN may be employed in some embodiments (e.g., alloys using Indium (In) such as InGaN or InAlGaN), although AlGaN is the most commonly employed at the time of this disclosure. Beryllium dopant stands in contrast to magnesium (Mg) dopant typical of p-type material in ultraviolet light-emitting diodes (UV LEDs). Beryllium substituted for a Ga site ($Be_{Ga}$) has a shallow acceptor state (0.113 eV from the valence band), twice shallower than the $Mg_{Ga}$ acceptor. The $Be_{Ga}$ is a dual-nature acceptor with a shallow state at 0.113 eV and a deep state at 0.58 eV.

Figure 1A:
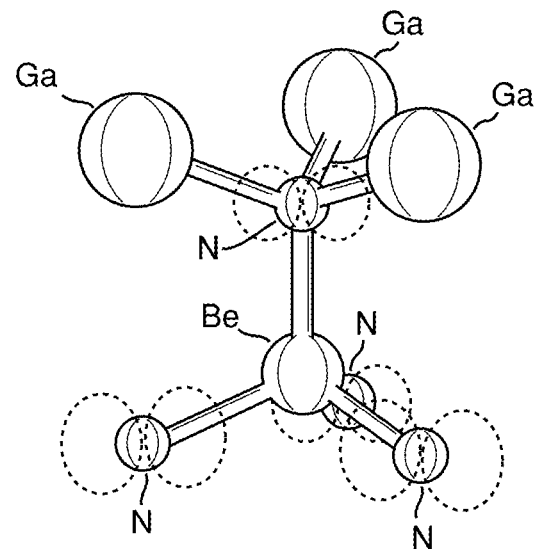
FIGS. 1A and 1B are ball-and-stick diagrams of Be-doped GaN.
Figure 1B:
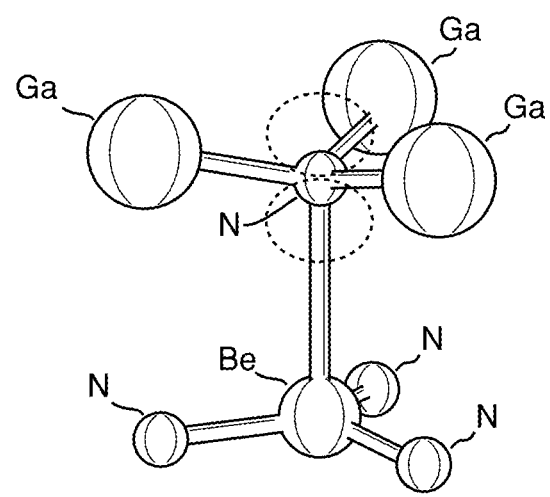

FIGS. 1A and 1B show ball-and-stick models of Be-doped gallium nitride (GaN:Be) according to a preferred defect for some embodiments. The small atoms are nitrogen (N), medium atoms are beryllium (Be), and large atoms are gallium (Ga). FIG. 1A represents the shallow state, whereas FIG. 1B represents the deep state. Isosurfaces (at 10% of the maximum values) of the hole spin density for both shallow and deep states are shown using broken lines.

Figure 2:
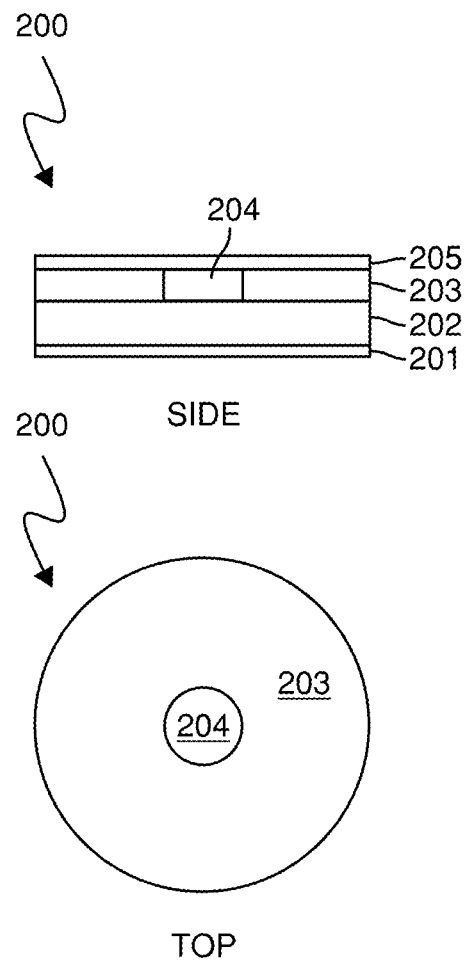
FIG. 2 is an exemplary UV LED.

FIG. 2 presents a structure of an exemplary light source, in particular a UV LED 200, from both a side view and top view. The UV LED 200 comprises a first electrical contact 201, an n-type region 202, a first p-type region 203, a second p-type region 204, and a second electrical contact 205. More specifically, as non-limiting examples, the first contact 201 may be a transparent oxide (such as ZnO or ITO); the n-type region 202 may be for example Si-doped or Ge-doped GaN or AlGaN; the first p-type region 203 may be Be-doped GaN or AlGaN; the second p-type region 204 may be Mg-doped GaN or AlGaN; and the second contact 205 may be a metal. In the configuration of UV LED 200 depicted by FIG. 2, the first and second p-type regions 203 and 204 together form a single layer of the semiconductor structure atop the n-type region 202, such that each of the regions 203, 204, and 202 contact one another and are sandwiched between the contacts 201 and 205. The layer formed by regions 203 and 204 may be a single, monolithic layer of AlGaN, for example, which is subsequently doped with different dopants in different regions of the layer. As conveyed by the top view (which omits contact 205), the second p-type region 204 of this layer may be substantially smaller than the remainder of the layer which forms the first p-type region 203 (e.g., 10% or less of the layer may be the second p-type region 204; 90% or more of the layer may be the first p-type region 203), for reasons discussed below in connection with the operation of the LED 200. The n-type region 202 is a single, uniform layer which forms a p-n junction with each of the respective p-type regions 203 and 204.

Figure 3:
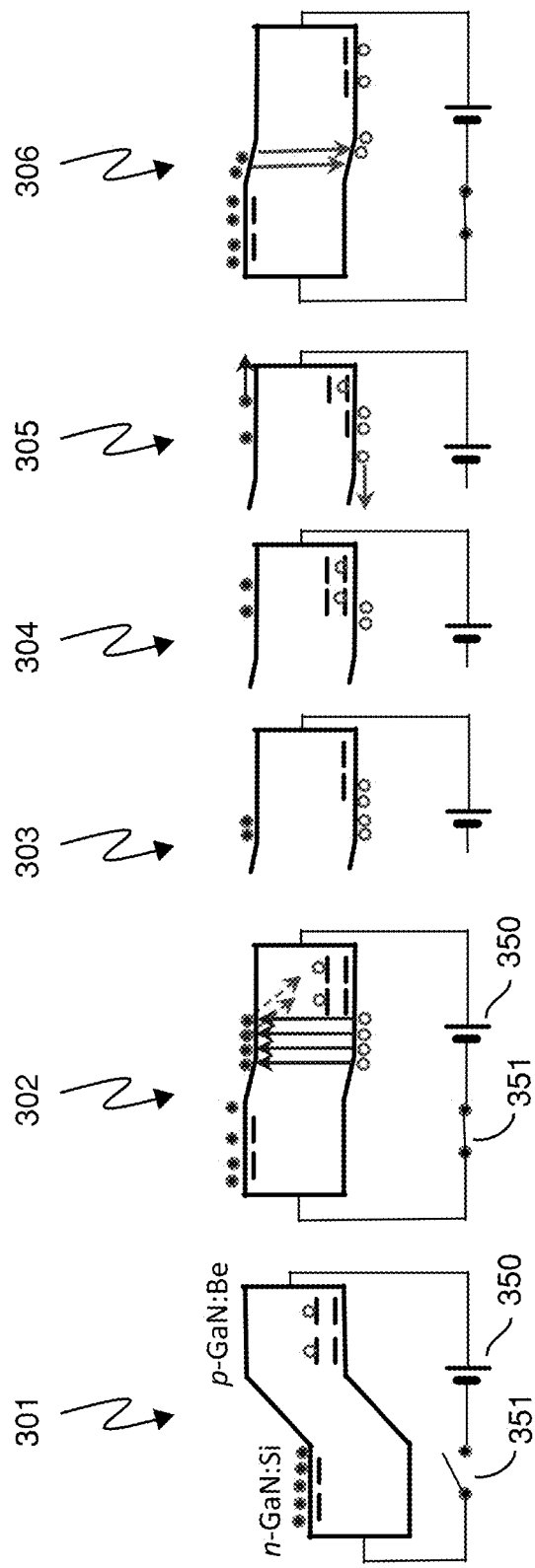
FIG. 3 is a visual explanation of the operation of the UV LED of FIG. 2 using a band diagram.

FIG. 3 illustrates the operation of the UV LED 200 of FIG. 2 using a band diagram. At stage 301, the LED 200 is in the dark and before bias is applied from a power source 350. Note that the Mg-doped AlGaN region 204 and standard quantum wells in the p-n junction are not shown. At stage 302, a direct bias from power source 350 is applied between the contacts 201 and 205 by closing switch 351 to the LED 200. Initially, electrical current flows via a narrow Mg-doped channel (not shown in FIG. 3). The LED 200 is working (emitting some UV light), but its efficiency is low. Nevertheless, the produced UV light is partly absorbed in the Be-doped GaN region 203, where it excites electrons from the valence band to the conduction band (solid arrows). The photogenerated electrons recombine with holes at the Be acceptors (dashed arrows). Stage 303 shows that after initial electron-hole recombination, the acceptors become negatively charged (a single level). In the next stage 304, free holes are captured by the shallow Be levels. At stage 305, the Be level is so shallow that the emission of holes back to the valence band is very efficient.

Stage 306 shows the LED after a short time of operation (short time since the start of application of bias), at which point only the shallow states of nearly all Be acceptors are involved in transitions of charges. Holes are abundant in the valence band. The holes move under bias to the p-n junction, where they recombine with electrons from the n-type region and produce bright UV LED light (solid arrows). The free holes are also captured by the shallow state of the Be acceptors but almost instantly emitted back to the valence band at room temperature because the ionization energy of the shallow Be acceptor is very low. The efficiency (the ratio of emitted light power to the consumed electrical power) of the UV LED 200 is high because holes are abundant in the p-type region 203 (when the LED operates), and the holes' mobility is high compared to Mg-doped material (like region 204) because the concentration of Be and other defects is much lower than in Mg-doped material.

Figure 4:
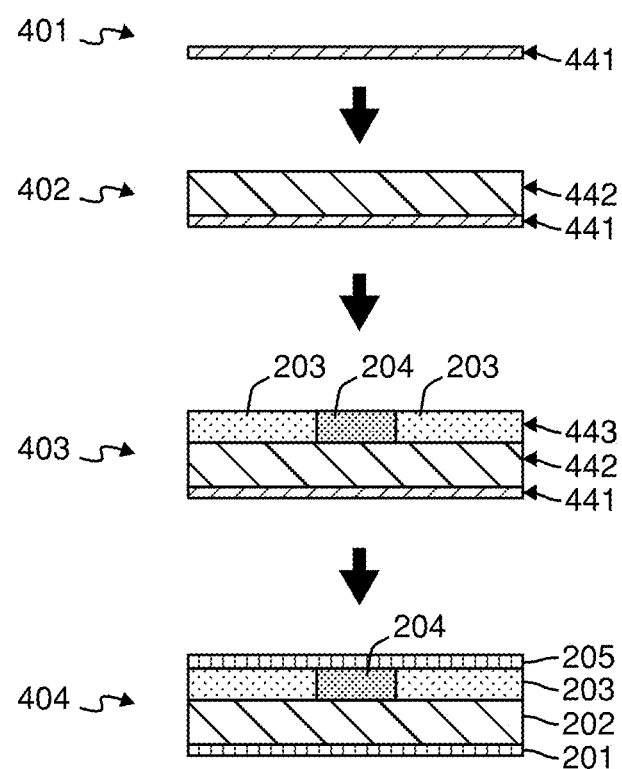
FIG. 4 shows stages of producing an exemplary UV-LED device.

FIG. 4 presents exemplary stages of producing a semiconductor device such as but not limited to the UV LED 200 of FIG. 2. Stage 401 shows a substrate 441 such as but not limited to sapphire crystal. At stage 402, an n-type layer 442 is grown atop the substrate 441. The n-type layer 442 corresponds with region 202 of LED 200. Next, at stage 403 a p-type layer 443 is grown on top of the n-type layer 442, forming a p-n junction. Growth stages may be, for example, crystal growth in the vapor phase at high temperatures. The production of p-type layer 443 may, in practice, be several steps (such as but not limited to masking and dry etching, and/or via implanting with masks for different regions) which culminate in chemically distinct regions by stage 403. Here, regions 203 and 204 of LED 200 are distinguishable by stage 403 after separate doping subprocesses for region 203 versus region 204. For stage 404, substrate 441 is removed and contacts 201 and 205 are added. Alternatively, in some LEDs the substrate may remain. Contacts may be metalized after dry etching with masks. Those of skill in the art will recognize the applicability of various established LED manufacturing techniques within the context of the present disclosure. Exemplary LEDs such as LED 200 of FIG. 2 may include additional components standard to LEDs, such as multiple quantum wells inside the p-n junction.

When a crystal or semiconductor layer is grown by MOCVD technique, the sources generally contain Ga and N atoms, and GaN material grows (50% of Ga and 50% of N, like in NaCl salt). The bandgap of GaN is 3.4 eV, thus an LED can be made emitting light with a wavelength of about 360-400 nm. If the sources contain Al and N, then AlN crystal (layer) grows (50-50%), and the bandgap of AlN semiconductor is 6 eV (an LED from AlN would emit light with a wavelength of 200 nm). However, when the sources contain Ga, Al, and N, then AlGaN alloy grows, in which Al+Ga=50% and N=50%). The bandgap of AlGaN can be gradually changed from 3.4 eV to 6 eV by increasing the ratio of Al fraction from 0 to 50%. For UV LEDs emitting at wavelengths between 300 and 220 nm, Al content should be roughly between 10 and 40% (in the literature, the range may be given as between 20 and 80%, meaning that Ga+Al=100%). An exemplary efficient LED should have a conductive n-type region and a conductive p-type region that form a p-n junction. If one of the parts is not conductive, a high voltage must be applied, the current is low, and the efficiency is low. The ionization energy of an acceptor (Mg or Be) roughly scales with the bandgap. For Mg it changes from 0.2 to 0.5 eV when the content of Al in AlGaN changes from 0 to 50%. The electrical conductivity depends exponentially on the ionization energy; it may drop by several orders of magnitude when the ionization energy increases from 0.2 to 0.5 eV. Exemplary embodiments herein replace Mg with Be, because according to calculations and preliminary experimental results the Be ionization energy is 0.1 eV and expected to be 0.2-0.3 eV in AlN and between these values in AlGaN. An important application for such conductive p-type material with bandgap between 3.4 and 6 eV is UV LEDs emitting at wavelengths between 220 and 300 nm. However, embodiments need not be focused only on p-type AlGaN alloy. Highly conductive p-type GaN doped with Be according to this disclosure may be employed in many important and useful applications. Its use will increase the efficiency of blue LEDs made of GaN or InGaN alloys. It also may be beneficial for high-power devices made of or including GaN.

The production of a conductive p-type layer 443, specifically Be-doped region(s) 203, presents difficulties because of Be acceptors' compensation with unwanted donors such as interstitial Be defects. However, exemplary embodiments present solutions for successfully manufacturing conductive p-type GaN by doping with Be. The conductivity of "conductive p-type" material strongly depends on composition of AlGaN, and on degree of compensation of Be (or Mg) acceptors by unwanted donors. The conductivity of Be-doped GaN may exceed that of Mg-doped GaN by a factor of 100 because of twice smaller ionization energy if other parameters (the degree of compensation, or composition of AlGaN) are the same. That said, the numbers for the conductivity of GaN:Be may vary in the range of 1 to 100 S/cm, for example. In contrast to "conductive," "high-resistivity" and "semi-insulating" mean that it is difficult or impossible to measure electrical conductivity.

At a high level, exemplary methods of manufacturing conductive p-type Be-doped GaN comprise growing beryllium-doped gallium nitride (GaN:Be) and subsequently annealing the grown sample to cause dissociation of Be—H complexes and/or Be—O complexes and an increase $Be_{Ga}$ acceptor concentration. More specifically, according to some exemplary embodiments, it is preferable to perform the growth step in the presence of hydrogen, such as atomic hydrogen or positively charged hydrogen. Hydrogen itself is positively charged in GaN (AlGaN) as it loses an electron. Positively charged hydrogen efficiently binds with the negatively charged $Be_{Ga}$ acceptors to form the $Be_{Ga}$—$H_i$ complex. The most stable configuration of this complex with calculated binding energy varying between 1.8 and 2.0 eV (depending on the Fermi energy) is hydrogen occupying a bond-center site between $Be_{Ga}$ and nearest N neighbors, which pushes Be from the Ga site along the Be—N bond by 0.6 Å. A suitable growth process in which hydrogen may be present is metalorganic chemical vapor deposition (MOCVD). Irrespective of whether the growth process is conducted in the presence or absence of hydrogen, oxygen may be present during the growth stage according to various known techniques for growing GaN. In the presence of oxygen, the formation of the $Be_{Ga}$-$O_N$ complex is likely due to its relatively low formation energy. Accordingly, the growth step may involve the formation of $Be_{Ga}$—$H_i$ complexes and/or $Be_{Ga}$—$O_N$ complexes. The growth step may be conducted in nitrogen rich (N-rich) environment to minimize the formation of nitrogen vacancies ($V_N$) and $Be_{Ga}$—$V_N$ complexes.

The annealing step, properly configured, advantageously increases $Be_{Ga}$ acceptor concentration dramatically. The annealing step may be performed at relatively low temperatures, for instance 900° C. or less. An exemplary temperature range for the annealing step is 600-900° C. The annealing step serves the function of dissociating the $Be_{Ga}$—$H_i$ complexes and $Be_{Ga}$—$O_N$ complexes, whichever are present in the grown GaN:Be layer. Annealing in nitrogen ($N_2$) ambient will out-diffuse and evaporate hydrogen, leaving the $Be_{Ga}$ acceptors uncompensated and producing a p-type GaN.

EXAMPLE 1

Figure 5:
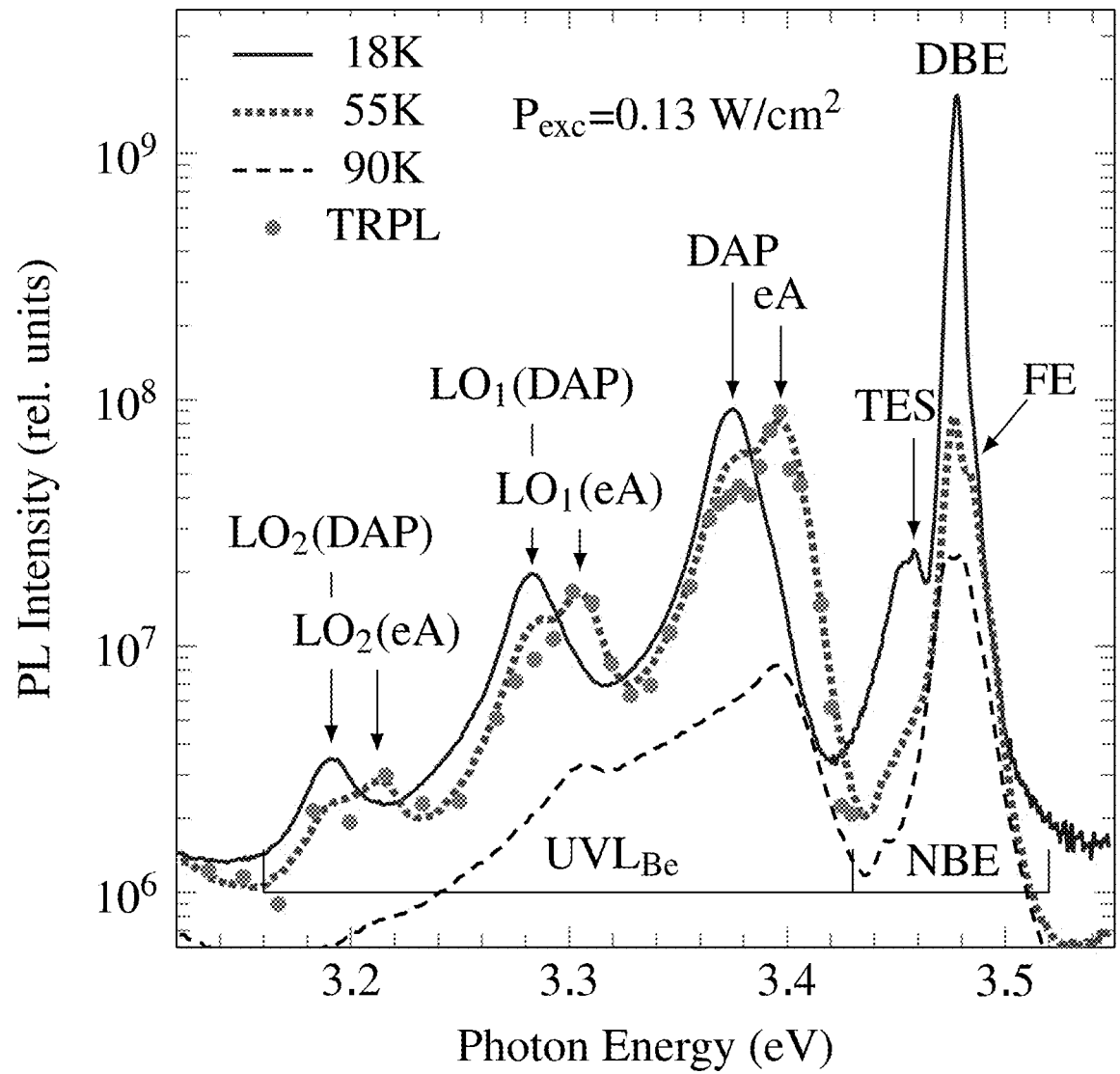
FIG. 5 shows evolution of the PL spectrum with temperature for GaN:Be (sample 0408b) at Pexc=0.13 W/cm2. The DAP peaks with the ZPL at 3.375 eV transform to identical in shape eA peaks with the ZPL at 3.395 eV. The LO phonon replicas follow the ZPL. The NBE emission consists of the two-electron satellite (TES), donor-bound exciton (DBE) and free exciton (FE) peaks. The time-resolved PL spectrum is shown with filled circles for the time-delay of 14 µs at T=55 K.
Figure 6:
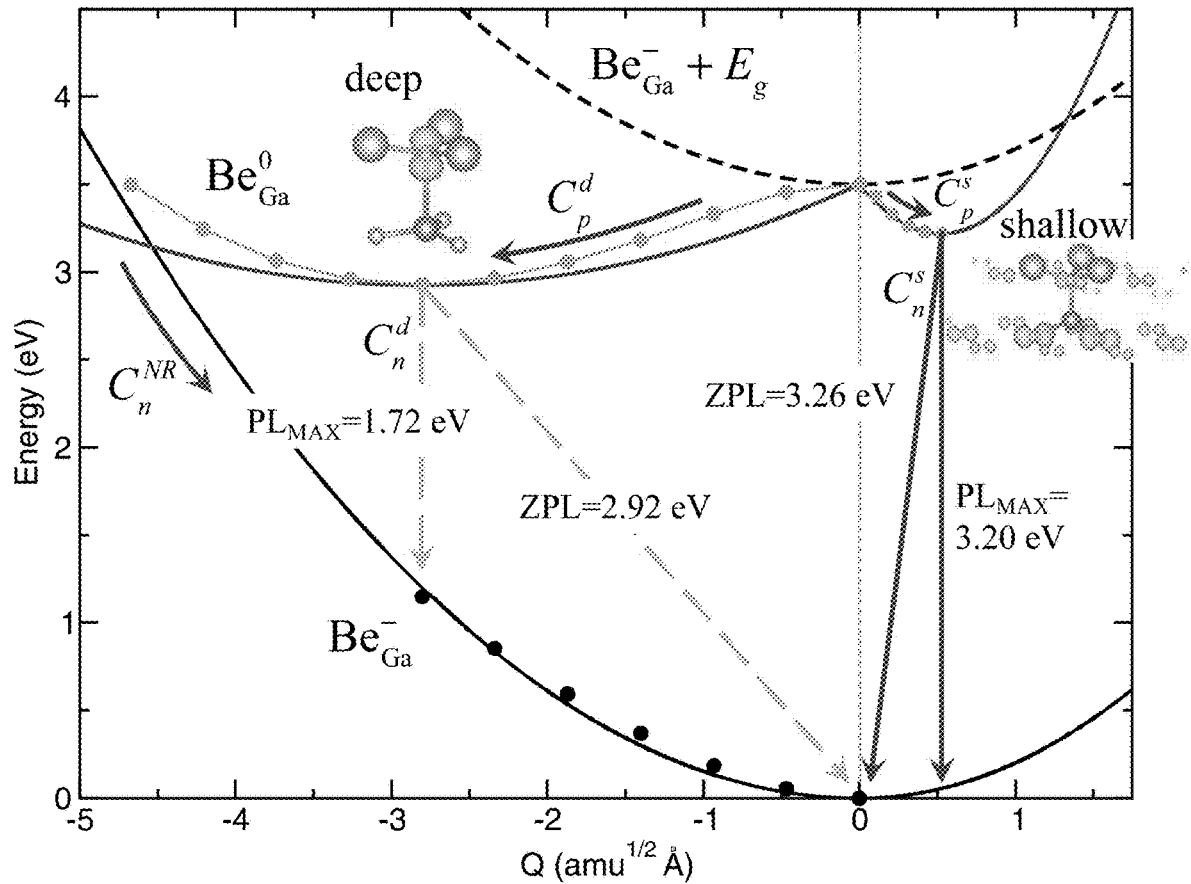
FIG. 6 is a configuration coordinate diagram for the $Be_{Ga}$ acceptor in GaN. The adiabatic potentials are obtained by fitting into HSE computed transition energies using the harmonic approximation. Direct HSE calculations are also performed (filled circles). Isosurfaces (at 10% of the maximum values) of the hole spin density for both shallow and deep states are shown along with $Be_{Ga}$ nearest neighbors. Larger molecular depictions are provided in FIGS. 1A and 1B.

FIGS. 5 and 6, and their accompanying descriptions below, explain PL measurements of optical transitions via the $Be_{Ga}$ acceptor in GaN which show that the $Be_{Ga}$ has a shallow, effective-mass-like state with the 0/− transition level at 113±5 meV, which is responsible for the $UVL_{Be}$ band with the main peak at 3.38 eV.

FIG. 5 shows the high-energy portion of the PL spectrum. The near band edge (NBE) emission is dominated by a peak at 3.478 eV, which is attributed to the donor-bound exciton (DBE) recombination. The peaks at about 3.46 eV are identified as the two-electron satellites (TES) that appear when the DBE annihilates, leaving the donor electron in one of the excited states. The kink on the high energy side of the DBE line, at 3.484 eV, can be better resolved at 55 K and is attributed to the free exciton (FE). At lower photon energies, the PL spectrum is dominated by the $UVL_{Be}$ band, which is attributed to the $Be_{Ga}$ acceptor. At T=18 K, the $UVL_{Be}$ band is caused by electron transitions from shallow donors to the $Be_{Ga}$ acceptor, the so-called donor-acceptor pair (DAP) transitions. The strongest peak at 3.375 eV is the ZPL (FWHM=23 meV), which is followed by three LO phonon replicas separated by 92 meV. The Huang-Rhys factor estimated from the shape of the band is 0.2, a value typical for shallow acceptors, and lower than that for the $Mg_{Ga}$ (0.4). With increasing excitation intensity, $P_{exc}$, from $10^{-5}$ to 0.1 W/cm$^2$ at T=18 K, the $UVL_{Be}$ band shifts to higher energies by 6 meV, which agrees with its DAP nature.

It is expected that the DAP recombination mechanism is replaced with the eA mechanism (transitions from the conduction band to the same acceptor) with increasing temperature. The temperature behavior of the $UVL_{Be}$ band is shown in FIG. 5. With increasing temperature from 18 K to 55 K, the DAP component of the $UVL_{Be}$ band gradually disappears, and the eA component, with identical shape but shifted to higher energies by 20 meV, emerges. The ZPL of the eA-related band at 3.395 eV can be used to find the ionization energy of the $Be_{Ga}$ acceptor, $E_A$ precisely. By taking the difference between the FE and eA peaks and adding the FE binding energy (25 meV), $E_A$=113±5 meV is obtained from analysis of PL spectra at different temperatures in samples where these peaks are well resolved.

At T=55 K, time-resolved PL spectrum reveals the eA component of the $UVL_{Be}$ band (FIG. 5). The decay of PL is slow, so that the signal can be traced up to hundreds of µs. While the DAP-associated shift of the $UVL_{Be}$ peak was reported in the past, the replacement of the DAP component with the eA component with increasing temperature is observed for the first time. Such transformation is very similar to that observed for the $Mg_{Ga}$, $Zn_{Ga}$ and $C_N$ acceptors in GaN, which are responsible for the UVL, BL1 and YL1 bands, respectively. Considering the clear transformation of the DAP component to the eA component, the slow decay of PL after a laser pulse, the very low $E_A$, and the lowest Huang-Rhys factor among all known acceptors in GaN, all of these features indicate that $Be_{Ga}$ is the shallowest acceptor in GaN known to date.

FIG. 6 is a configuration coordinate diagram characterizing the nature of the shallow $Be_{Ga}$ acceptor in GaN. FIG. 6 was constructed using the defect energies computed using Heyd-Scuseria-Ernzerhof (HSE) hybrid functional, and mapping the displacements $\Delta R_i$ of atom masses $m_i$ onto a one-dimensional configuration coordinate Q as $$\Delta Q^2 = \sum_{i,x,y,z} m_i \Delta R_i^2.$$

Absorption of a photon above the bandgap creates an electron-hole pair, raising the energy of the system by $E_g$=3.5 eV (dashed adiabatic potential labeled $Be_{Ga}^- + E_g$). Similar to the case of the $Mg_{Ga}$ acceptor, HSE calculations show that the neutral $Be_{Ga}$ acceptor exhibits two very different defect states: a shallow effective-mass state at 0.24 eV above the VBM (a value overestimated by ~0.1 eV due to the supercell approach), and a deep polaronic state at 0.58 eV above the VBM. Note that FIG. 6 shows these defect states in two different directions of Q. Isosurfaces of the hole spin density show that in the deep polaronic state, the hole wavefunction is localized on the nearest nitrogen neighbor, with Be—N bond length increased by 0.7 Å from its equilibrium value. Small polaron states can be localized on any of the four nearest nitrogen atoms, with very similar lattice distortions and energies. The shallow state has the atomic configuration similar to that of the negative ground state, with a weakly localized hole. The calculated energy of the deep polaronic state of the $Be_{Ga}^0$ is 0.34 eV lower than that of the shallow state. A photogenerated hole can be captured by either of these two states, as shown by the arrows $C_p^s$ and $C_p^d$ in FIG. 6. The adiabatic potentials for the $Be_{Ga}^- E_g$ and both $Be_{Ga}^0$ states intersect at Q=0 (FIG. 6), where the neutral defect state eigenvalue is resonant with the valence band. Direct HSE calculations also show that there is no barrier for both states to capture the hole.

The above HSE calculations, illustrated by FIG. 6, predict two PL bands. First is a sharp line in the ultraviolet part of the spectrum with the PL maximum and ZPL at 3.20 eV and 3.26 eV, respectively (calculated Huang-Rhys factor is 2.8). Second is a very broad red PL band from the deep polaronic state with the PL maximum and ZPL at 1.72 eV and 2.92 eV, respectively (calculated Huang-Rhys factor is 32), in agreement with HSE calculations. The experimental value of the ZPL for the $UVL_{Be}$ band is 3.38 eV, in a reasonable agreement with the HSE calculations. However, as stated above, experiments do not reveal the predicted broad red band associated with the polaronic state.

The above apparent contradiction can be resolved by comparing the rates of electron and hole capture by the two defect states. Note that transitions via the shallow state must be radiative since there is no route for non-radiative transitions in this case, the potential curves of the neutral shallow and negative ground states do not intersect. Transitions via the deep state could be either radiative or non-radiative, depending on the width and height of the potential barrier formed by the intersection of the polaronic and the ground states potentials. To understand the optical properties of the $Be_{Ga}$ acceptor, carrier capture coefficients are calculated (FIG. 6), which define the rates of transitions as $C_{n,p}$=Vr, where r is the capture rate of a carrier by one defect in a supercell with volume V.

Non-radiative transitions can be analyzed using the method proposed by Alkauskas et al. (A. Alkauskas, Q. Yan, and C. G. Van de Walle, Phys. Rev. B 90, 075202 (2014)), where non-radiative transitions occur via multi-phonon emission between the initial $\chi_i$ and the final $\chi_f$ vibronic states of two harmonic adiabatic potentials. The transition rate, in this case, can be computed as $$r = f(T)\frac{2\pi}{\hbar}gW_{i,f}^2 \sum_m w_m \sum_n |\langle\chi_{im}|Q - Q_0|\chi_{fn}\rangle|^2 \delta(\Delta E + m\hbar\Omega_i - n\hbar\Omega_f), \quad (1)$$

where f(T) is a scaling factor which depends on the charge state of the defect and temperature T [23], g is the degeneracy of the final state, $W_{i,f}$ are the electron-phonon coupling matrix elements, $w_m$ is the thermal occupation of the vibrational state m, $Q_0$ is the shift between the adiabatic potentials, $\Delta E$ is the transition energy, and $\Omega_{i,f}$ are the vibrational frequencies of the initial (excited) and the final (ground) states, respectively. In the case of $Be_{Ga}$ acceptor, we find the polaronic and ground state vibrational energies $\hbar\Omega_{i,f}$ to be very similar at ~36 meV (obtained from direct HSE calculations, solid circles in FIG. 6). The electron-phonon coupling matrix elements are calculated using HSE as $$W_{i,f} = (\varepsilon_f - \varepsilon_i)\left\langle\psi_i \left|\frac{\partial\psi_f}{\partial Q}\right.\right\rangle, \quad (2)$$

where single-particle wavefunction $\Psi_i$ corresponds to the hole (electron) in the valence (conduction) band perturbed by the defect, $\Psi_f$ corresponds to the carrier localized on the defect, and $\varepsilon_{i,f}$ are the corresponding eigenvalues. This approach can be used to calculate both the non-radiative capture of the hole by the deep polaronic state $C_p^d$ and the non-radiative capture of the electron by the ground state $C_n^{NR}$ in FIG. 6.

The radiative transition rates (and corresponding capture coefficients) can be calculated from the Fermi's golden rule for the optical transition between the conduction band and the localized defect state:

$$r = \frac{4}{3} \frac{\alpha n \Delta E}{\hbar m^2 c^2} |\langle \psi_c | \hat{p} | \psi_d \rangle|^2, \quad (3)$$

where $\alpha$ is the fine structure constant, n is the index of refraction, $\Delta E$ is the transition energy, m is the free electron mass, $\Psi_{c,d}$ are the single-particle Kohn-Sham orbitals of the electron in the conduction band and the defect state, respectively, and $\hat{p}$ is the momentum operator. The transition rates are calculated in the equilibrium geometries of the deep and shallow states of the neutral acceptor, for the transition energies corresponding to the computed PL maxima.

TABLE I

Carrier capture coefficients for $Be_{Ga}$ acceptor in units of cm³/s.

| | Shallow State | Deep (polaron) state |
|---|---|---|
| Non-radiative hole capture | $C_p^s \sim 10^{-6} - 10^{-5}$ | $C_p^d = 10^{-7}$ |
| Non-radiative electron capture | N/A | $C_n^{NR} = 10^{-19}$ |
| Radiative electron capture | $C_n^s \sim 5 \times 10^{-12}$ | $C_n^d = 10^{-13}$ |

The results for the calculated capture coefficients are summarized in Table I. The radiative electron capture coefficient by the polaronic state $C_n^d$ is calculated to be $10^{-13}$ cm³/s, which would determine the lifetime of PL from the polaronic state. The non-radiative capture of an electron by the polaronic state is hindered by the potential barrier, and for the HSE computed potentials (solid circles in FIG. 6) at low temperature $C_n^{NR}$ is calculated to be $10^{-19}$ cm³/s. This low value stems from the significant width of the potential barrier for this transition (FIG. 6), suggesting that transitions via the polaronic state should be radiative. This indeed would be the case, if only one state of neutral acceptor existed for $Be_{Ga}$.

However, the efficiency of the radiative transitions is also determined by the competition for a photogenerated hole between the shallow and deep states. Both states capture the hole without a barrier (FIG. 6). The hole capture coefficient by the deep state $C_p^d$, calculated using Eq. (1), is $10^{-7}$ cm³/s. Note that thus calculated $C_p$ for a common acceptor in GaN, carbon acceptor $C_N$, (assuming hole capture without a barrier), is also about $10^{-7}$ cm³/s, in agreement with the measured value of $3 \times 10^{-7}$ cm³/s. The capture of a hole by the shallow state ($C_p^s$) cannot be readily calculated from first principles, because Equations (1-2) require evaluation of the single-particle wavefunctions, which are too extended to be reproduced in a supercell calculation of any reasonable size.

For the same reason, in the HSE calculations the shallow state transition level is an overestimated 0.24 eV vs. measured 0.11 eV. It is, however, known from experiment that $C_p^s$ for another shallow acceptor in GaN (magnesium acceptor $Mg_{Ga}$) is $10^{-6}$ cm³/. It should also be noted that the shallow state of $Mg_{Ga}$ (0.2 eV above the VBM) is deeper than that of $Be_{Ga}$ (0.11 eV), indicating that $Be_{Ga}$ defect state wavefunction is significantly more extended. Roughly $C_p^s$ can be estimated as $C_p^s = 4\pi Z e \mu/\kappa$, based on the carrier capture by a shallow attractive center limited by diffusion. Here, Z is the defect formal charge, e is the electron charge, μ is the hole mobility, and η is the bulk GaN dielectric constant. Within this approximation, the hole capture coefficient for the shallow state is estimated between $10^{-6}$ and $10^{-5}$ cm³/s, for the hole mobilities of 3-30 cm²/(Vs). In other words, the shallow state of $Be_{Ga}$ acceptor is 1-2 orders of magnitude more efficient in capturing photogenerated holes as compared to the polaronic state. Thus, upon optical excitation, the holes are predominantly captured by the shallow state, with subsequent PL in the UV region (the computed radiative electron capture coefficient $C_n^s$ is $5 \times 10^{-12}$ cm³/s).

The holes can also be captured by the polaronic state but at a significantly lower rate. This leads to the predicted PL intensity from the polaronic state lower, by 1-2 orders of magnitude, than that from competing radiative recombination responsible for the $UVL_{Be}$ band. In the experiment, the ratio of the peak intensities would be even larger, because the PL band from the polaronic state is expected to be significantly broader than the $UVL_{Be}$ band. Interestingly, the ratio of PL intensities related to the shallow and deep polaronic states must be the same in semiconductors with arbitrary compositions of defects, including n-type and p-type samples. Indeed, in the Shockley-Read-Hall phenomenological approach [34-36], these intensities are $I_s^{PL} = C_p^s N_A^- p$ and $I_d^{PL} = C_p^d N_A^- p$, respectively, where $N_A^-$ is the concentration of negatively charged $Be_{Ga}$ acceptors and p is the concentration of free holes. For the Shockley-Read-Hall phenomenological approach, see W. Shockley, and W. T. Read, Jr. Phys. Rev. 87, 835 (1952) and R. N. Hall, Phys. Rev. 87, 387 (1952). Then $$I_s^{PL}/I_d^{PL} = C_p^s/C_p^d,$$

independent of a specific sample. The same should be true for other defects with the dual nature, such as Mg and Zn acceptors in GaN or Li acceptor in ZnO.

In summary of Example 1 and the above discussion of FIGS. 5 and 6, PL measurements of optical transitions via the $Be_{Ga}$ acceptor in GaN show that the $Be_{Ga}$ has a shallow, effective-mass-like state with the 0/− transition level at 113±5 meV, which is responsible for the $UVL_{Be}$ band with the main peak at 3.38 eV. This means that the $Be_{Ga}$ forms the shallowest acceptor level in GaN known to date. This result is encouraging, particularly for AlGaN-based devices, where the concentration of free holes in p-type AlGaN alloy remains frustratingly low because of the large ionization energy of the $Mg_{Ga}$. The HSE calculations predict the dual nature of the Be acceptor, with the shallow state responsible for the $UVL_{Be}$ and a deep small polaronic state at 0.58 eV above the VBM, which is not observed in PL experiments. Calculated carrier capture coefficients suggest that the small polaron is significantly less efficient in capturing photogenerated holes than the shallow state. Therefore, the expected red PL band from the small polaron would be significantly lower in intensity than the $UVL_{Be}$ band. In the experiment it would also likely be buried under the bright $YL_{Be}$ band observed in the same region of the spectrum, making it especially challenging to resolve. Remarkably, the existence of the "bright" shallow state and the "dark" polaronic state of an acceptor appears to be a general phenomenon. The situation is similar for the $Mg_{Ga}$, $Zn_{Ga}$, $Cd_{Ga}$, and $Ca_{Ga}$ acceptors in GaN, where the theory predicts deep polaronic states, while they are not observed experimentally.

EXAMPLE 2

Theoretical calculations were performed using the Heyd-Scuseria-Ernzerhof (HSE) hybrid functional. The HSE functional was tuned to fulfill the generalized Koopmans condition for the $Mg_{Ga}$ acceptor in GaN (fraction of exact exchange of 0.25, the range separation parameter of 0.161 Å$^{-1}$). All calculations were performed in 300-atom hexagonal supercells at the Γ-point, with plane-wave energy cutoffs of 500 eV. All atoms were relaxed within HSE to minimize forces to 0.05 eV/Å or less. The formation energies of a defect X in a charge state q were calculated as:

$$E_{form} = E_{tot}(X^q) - E_{tot}(\text{GaN}) - \sum_\alpha n_\alpha \mu_\alpha + q(E_V + E_F) + \Delta E_{corr}^q, \quad (4)$$

where $E_{tot}(X^q)$ is the total energy of the supercell containing the defect and $E_{tot}(\text{GaN})$ is that without the defect, $n_\alpha$ is the number of atoms of an element α with the elemental chemical potential $\mu_\alpha$ added to or removed from the supercell, $E_v$ is the energy of the VBM, $E_F$ is the Fermi energy relative to the VBM, and $\Delta E_{corr}^q$ is the correction for spurious electrostatic interactions in periodic supercells. Chemical potentials, which determine the relative abundance of chemical elements during the growth process, depend on the phases competing with the GaN growth. Depending on the experimental growth conditions, chemical potentials vary between the bounds set by these competing phases, here assumed to be metallic Ga and $N_2$ molecule. Therefore, the formation of GaN is determined by the following thermodynamic condition $$\mu_{GaN} = \mu_{Ga}(\text{Ga metal}) + \mu_N(N_2) + \Delta H_f(\text{GaN}), \quad (5)$$

where $\Delta H_f(\text{GaN})$ is the formation enthalpy of GaN. In the limiting case of N-rich growth, the chemical potential of nitrogen is set to $\mu^N(N_2)$, while that of gallium is set to $\mu_{Ga}(\text{Ga metal}) + \Delta H_f(\text{GaN})$. In the case of Ga-rich growth, $\mu_N = \mu_N(N_2) + \Delta H_f(\text{GaN})$ and $\mu_{Ga} = \mu_{Ga}(\text{Ga metal})$. In the presence of oxygen, the formation of beryllium defects is assumed to be limited by the growth of beryllium oxide BeO: $\mu_{Be} + \mu_O = \mu_{BeO}$. In turn, the chemical potential of oxygen is assumed to be limited by the formation of gallium oxide $Ga_2O_3$: $2\mu_{Ga} + 3\mu_O = \mu_{Ga_2O_3}$. Finally, two possibilities were considered for the chemical potential of hydrogen: the formation of a hydrogen molecule, $\mu_H = \mu_H(H_2)$, or ammonia, $\mu_N + 3\mu_H = \mu_{NH_3}$.

Figures 7A, 7B:
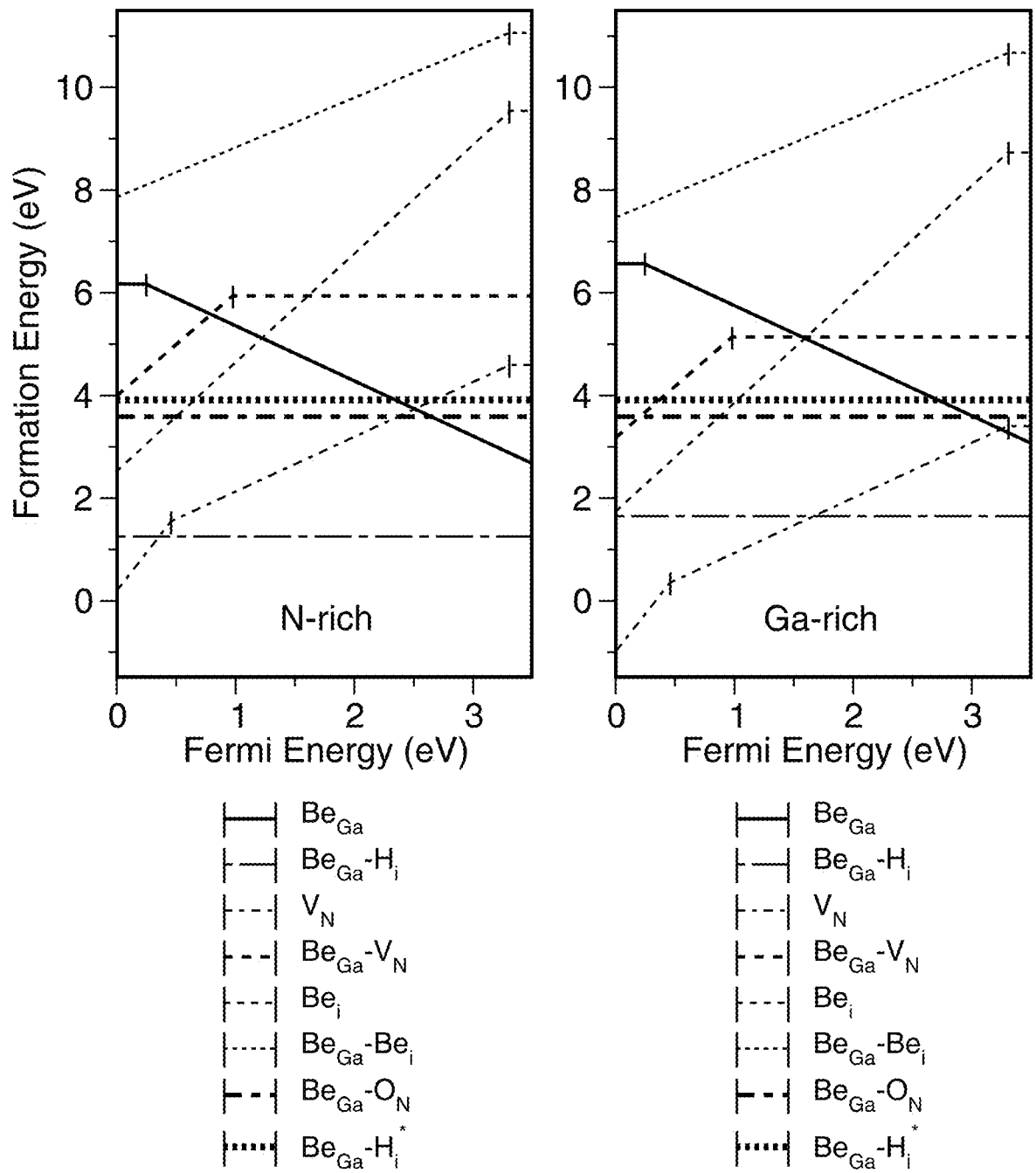
FIG. 7A shows calculated formation energies of Be-related defects in GaN: the shallow $Be_{Ga}$ acceptor, $Be_{Ga}$—$H_i$ complex (for $\mu_H$ from $H_2$ and $NH_3$, the latter is labeled $Be_{Ga}$—$H_i$*), nitrogen vacancy $V_N$, $Be_{Ga}$—$V_N$ complex, Be interstitial $Be_i$, $Be_{Ga}$—$Be_i$ complex, and $Be_{Ga}$—$O_N$ complex in nitrogen-rich conditions.
FIG. 7B shows calculated formation energies of Be-related defects in GaN: the shallow $Be_{Ga}$ acceptor, $Be_{Ga}$—$H_i$ complex (for $\mu_H$ from $H_2$ and $NH_3$, the latter is labeled $Be_{Ga}$—$H_i$*), nitrogen vacancy $V_N$, $Be_{Ga}$—$V_N$ complex, Be interstitial $Be_i$, $Be_{Ga}$—$Be_i$ complex, and $Be_{Ga}$—$O_N$ complex in gallium-rich conditions.

The results of the formation energy calculations are presented in FIG. 7. Although this acceptor exhibits a shallow transition level that is the lowest of all known acceptors in GaN to date, producing a p-type Be-doped GaN faces challenges due to several compensating defects. First of all, even in an ideal impurity-free growth situation, self-compensation of the p-type material presents an obstacle. Beryllium interstitial defect ($Be_i$) has lower formation energy in p-type material by about 2 eV. This suggests that if the initial stages of growth produce p-type material due to the formation of $Be_{Ga}$ acceptors, pushing the Fermi level towards the valence band will lead to an overwhelming fraction of Be atoms going to the interstitial sites, rather than substituting for Ga. In addition, since $Be_i$ is a double donor, each $Be_i$ defect would compensate two $Be_{Ga}$ acceptors. The high formation energy of the $Be_{Ga}$-$Be_i$ complex suggests that it does not play a substantial role in the compensation mechanism.

Since Be acceptor substitutes for the gallium atom, p-type doping is more favorable in the N-rich regime, where Ga vacancies are likely to be filled with Be atoms. Note that the nitrogen vacancy, which is a donor, exhibits low formation energy even in this growth regime. The formation of the $Be_{Ga}$-$V_N$ complexes is also about as likely as the formation of the isolate $Be_{Ga}$. In addition, since oxygen is commonly present in GaN samples grown by various techniques, the formation of the $Be_{Ga}$-$O_N$ complex is also likely due to its relatively low formation energy. In these calculations, the $Be_{Ga}$-$O_N$ complex is stable and electrically neutral, with a binding energy of 1.8 eV. It does not exhibit any transition levels in the bandgap, suggesting that the attribution of $YL_{Be}$ band to this complex is unlikely. Overall, based on these results, it is difficult to expect efficient p-type by using straightforward hot growth of Be-doped GaN. Most likely, high levels of compensation will occur, with the Fermi level pinned near the middle of the bandgap, producing a high resistivity material.

However, calculations show that it is possible to circumvent the compensation issues in a way similar to that used to produce Mg-doped p-type GaN. Namely, positively charged hydrogen is expected to efficiently bind with the negatively charged $Be_{Ga}$ acceptors to form the $Be_{Ga}$—$H_i$ complex. The most stable configuration of this complex with calculated binding energy varying between 1.8 and 2.0 eV (depending on the Fermi energy) is hydrogen occupying a bond-center site between $Be_{Ga}$ and nearest N neighbors, which pushes Be from the Ga site along the Be—N bond by 0.6 Å. The formation energy of this complex is the lowest among all considered defects, with the only exception of the nitrogen vacancy for the Fermi level close to the valence band.

Furthermore, the $Be_{Ga}$—$H_i$ complex is electrically neutral at any Fermi energies; i.e., it does not have transition levels in the bandgap. For the chemical potentials of hydrogen determined by the formation of ammonia, the formation energy of the $Be_{Ga}$—$H_i$ complex is significantly higher. However, even in this case for N-rich growth, the formation of this complex is still energetically most favorable among Be-related defects for the Fermi energies from 0.65 to 2.35 eV above the VBM (while for $E_F$>2.65 eV, $Be_{Ga}$ acceptor is the lowest energy defect). This offers an opportunity to grow Be-doped n-type GaN in the presence of hydrogen, where the Fermi level is pushed closer to the conduction band by natural shallow donors, such as $O_N$. In this case, Be atoms will predominantly occupy the gallium sites (since $Be_i$ interstitials will be extremely energetically unfavorable) and form complexes with mobile interstitial hydrogen. Subsequent annealing in nitrogen ambient (pure nitrogen gas at atmospheric pressure, or higher pressure if desired) will out-diffuse and evaporate hydrogen, leaving the $Be_{Ga}$ acceptors uncompensated and producing a p-type GaN. A very shallow transition level of the $Be_{Ga}$ suggests that this growth route produces a p-type GaN with significantly higher hole concentrations compared to that produced by Mg-doping.

Prior attempts to activate the shallow Be acceptor in Be-doped MBE GaN led to an increase of the $UVL_{Be}$ intensity, yet the samples remained semi-insulating. PL from Be-doped, Ga-polar GaN samples grown on sapphire substrates were studied by RF-plasma-assisted MBE. The Ga-polar 1 μm-thick GaN layers with the concentration of Be between $5 \times 10^{17}$ and $1 \times 10^{20}$ cm$^{-3}$ were grown on top of the ~0.1 μm-thick undoped GaN on sapphire substrates. Three GaN:Be samples were grown in the presence of atomic hydrogen. The presence of H enhanced the incorporation of Be at low Be fluxes. In most cases, the $Be_{Ga}$-related $UVL_{Be}$ intensity greatly increased after annealing samples at T=900° C. for two hours in $N_2$ ambient. Note that no conductive p-type was obtained in these experiments; the samples remained semi-insulating after the annealing.

Figures 8A, 8B:
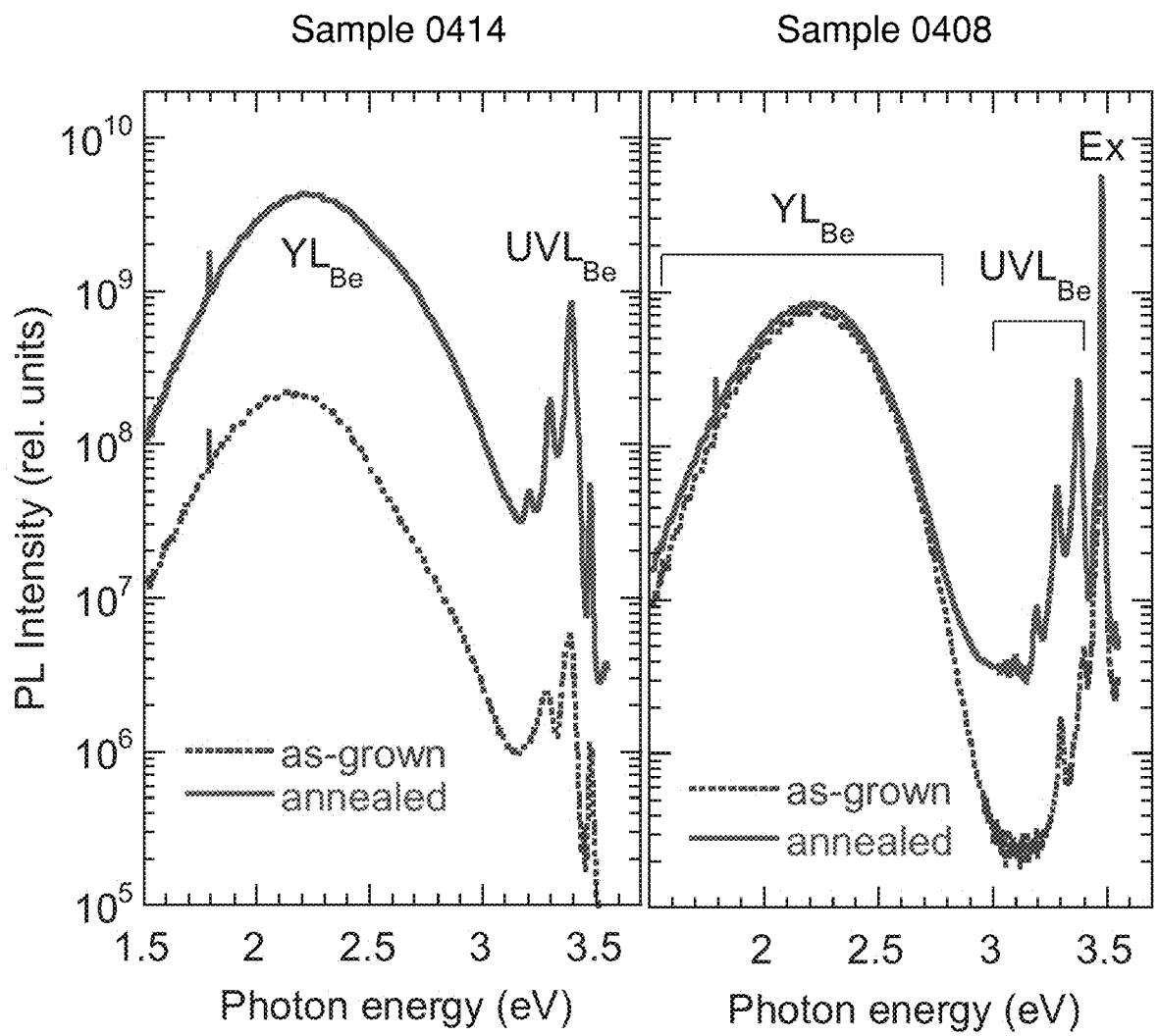
FIG. 8A is PL spectra from GaN:Be,H samples 0414a,b with [Be]=$1\times10^{19}$ cm$^{-3}$ before and after annealing at 900° C. for two hours in $N_2$ ambient.
FIG. 8B is PL spectra from GaN:Be samples 0408a,b with [Be]=$5\times10^{17}$ cm$^{-3}$ before and after annealing at 900° C. for two hours in $N_2$ ambient. The excitation intensity is 0.13 W/cm$^2$ and T=20 K. The exciton line at 3.478 eV is labeled "Ex".

FIGS. 8A and 8B shows PL spectra of GaN:Be before and after annealing at 900° C. for two hours in $N_2$ ambient. The PL spectra are measured in identical conditions. Sample 0408 of FIG. 8B with the concentration of Be $5\times10^{17}$ cm$^{-3}$ was grown without additional hydrogen, while sample 0414 of FIG. 8A with [Be]=$10^{19}$ cm$^{-3}$ contained a high concentration of H. The intensity of the broad $YL_{Be}$ band at 2.2 eV remained the same after the annealing for sample 0408 and increased by a factor of 20 for sample 0414. This indicates that the origin of the $YL_{Be}$ is likely unrelated to the $Be_{Ga}$-$O_N$ complex, which is expected to dissociate at 900° C. Therefore, the attribution of the $YL_{Be}$ to a specific defect is left uncertain. The zero-phonon line of the $UVL_{Be}$ band originating from the shallow state of the $Be_{Ga}$ acceptor is located at 3.37-3.38 eV, accompanied by weaker LO phonon replicas. Remarkably, the $UVL_{Be}$ band with relatively high intensity emerges only after the annealing in sample 0408 and increased by a factor of 100 in sample 0414, indicating a significant increase in the number of the $Be_{Ga}$ acceptors in these samples. The significant rise of PL intensity after annealing for sample 0414 containing a high concentration of H (higher than for the control sample, which was grown without a hydrogen source) suggests that a significant part of the $Be_{Ga}$ defects could be passivated with H, and the annealing activated these acceptors by dissociating the $Be_{Ga}$—$H_i$ complexes. However, no significant concentration of H is expected in Be-doped GaN grown by RF-plasma-assisted MBE without H, and the emergence of the $UVL_{Be}$ band in sample 0408 after annealing is surprising.

HSE calculations (FIG. 7) suggest that in this case $Be_{Ga}$ acceptors could be passivated by oxygen, forming the $Be_{Ga}$—$O_N$ complexes. Both the $Be_{Ga}$—$H_i$ and $Be_{Ga}$—$O_N$ complexes are predicted to be electrically neutral, energetically favorable, and have similar binding energies of ~1.8 eV, indicating that either complex would convert into an isolated $Be_{Ga}$ acceptor upon annealing at 900° C. (FIG. 8). However, since hydrogen is easier to out-diffuse, co-doping with hydrogen during growth would be advantageous for Be activation.

In summary of Example 2 and the above discussion of FIGS. 7, 8A, and 8B, both experimental results and theoretical calculations suggest a route for p-type Be doping of GaN. Nitrogen-rich growth of GaN doped with Be in the presence of hydrogen will lead to the preferential formation of the $Be_{Ga}$—$H_i$ complexes, which are electrically neutral and do not exhibit any transition levels in the bandgap. The formation energy of the complex is independent of the Fermi energy and remains low during growth. Therefore, n-type GaN can be initially grown, containing a large number of neutral $Be_{Ga}$—$H_i$ complexes. Subsequent annealing can dissociate these complexes, removing hydrogen atoms and activating the p-type conductivity of GaN.

Where a range of values is provided in this disclosure, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are described.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be separated from or combined with the features of any of the other several embodiments without departing from the scope or spirit of the present invention. Any recited method can be carried out in the order of events recited or in any other order which is logically possible. Alternative methods may combine different elements of specific detailed methods described above and in the figures.

While exemplary embodiments of the present invention have been disclosed herein, one skilled in the art will recognize that various changes and modifications may be made without departing from the scope of the invention as defined by the appended claims.

What is claimed is:

1. A light source operable at room temperature, comprising
   a first p-type region of Be-doped GaN or AlGaN;
   an n-type region that forms a first p-n junction with the first p-type region; and
   a second p-type region that forms a second p-n junction with the n-type region, wherein the second p-type region does not include a Be-doped p-type material, wherein the second p-n junction is configured to emit a first UV emission,
   wherein the Be-doped GaN or AlGaN of the first p-n junction is configured so that the first UV emission is at least partly absorbed by the Be-doped GaN or AlGaN, wherein UV absorption in the Be-doped GaN or AlGaN causes a transfer of bound holes from a deep state of the Be to a shallow state of the Be, increasing p-type conductivity of the first p-type region,
   wherein the first p-n junction is configured to produce a second UV emission after being initiated by the first UV emission.

2. The light source of claim 1, wherein the n-type region is Si-doped or Ge-doped GaN or AlGaN.

3. The light source of claim 1, wherein the second p-type region is Mg-doped GaN or AlGaN.

4. The light source of claim 1, wherein all three of the first p-type region, the n-type region, and the second p-type region physically contact one another.

5. The light source of claim 1, wherein the first p-type region and the second p-type region together form a single layer formed on top of the n-type region.

* * * * *